(12) United States Patent
Bellizzi et al.

(10) Patent No.: US 12,412,796 B2
(45) Date of Patent: Sep. 9, 2025

(54) METHOD OF MANUFACTURING SEMICONDUCTOR DEVICES AND CORRESPONDING SEMICONDUCTOR DEVICE

(71) Applicant: STMICROELECTRONICS S.r.l., Agrate Brianza (IT)

(72) Inventors: Antonio Bellizzi, Milan (IT); Guendalina Catalano, Augusta (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 588 days.

(21) Appl. No.: 17/895,783

(22) Filed: Aug. 25, 2022

(65) Prior Publication Data

US 2023/0066285 A1 Mar. 2, 2023

(30) Foreign Application Priority Data

Aug. 31, 2021 (IT) .......................... 102021000022607

(51) Int. Cl.
*H01L 23/31* (2006.01)
*H01L 21/56* (2006.01)
(Continued)

(52) U.S. Cl.
CPC .......... *H01L 23/3121* (2013.01); *H01L 21/56* (2013.01); *H01L 21/6836* (2013.01);
(Continued)

(58) Field of Classification Search
CPC . H01L 23/3121; H01L 21/56; H01L 21/6836; H01L 23/293; H01L 23/49527;
(Continued)

(56) References Cited

U.S. PATENT DOCUMENTS

| | | |
|---|---|---|
| 2009/0072379 A1 | 3/2009 | Ewe et al. |
| 2011/0127675 A1 | 6/2011 | Ewe et al. |

(Continued)

FOREIGN PATENT DOCUMENTS

DE 102021102421 A1 8/2021

*Primary Examiner* — Jeff W Natalini
*Assistant Examiner* — Rose Keagy
(74) *Attorney, Agent, or Firm* — Seed IP Law Group LLP

(57) ABSTRACT

A semiconductor device comprises: one or more semiconductor dice arranged on a substrate such as a leadframe, an insulating encapsulation of, e.g., LDS material molded onto the semiconductor die or dice arranged on the substrate, the encapsulation having a surface opposite the substrate, and electrically conductive formations (e.g., die-to-lead 181, 182, 183 or die-to-die 201, 202) provided in the encapsulation and coupled to the semiconductor die or dice arranged on the substrate. A tape is laminated onto the surface of the encapsulation opposite the substrate and electrically conductive contacts to the electrically conductive formations extend through the tape laminated onto the encapsulation. The length of the electrically conductive contacts is thus reduced to the thickness of the tape laminated onto the encapsulation, thus facilitating producing, e.g., "vertical" MOSFET power devices having a reduced drain-source "on" resistance, $RDS_{ON}$.

22 Claims, 4 Drawing Sheets

(51) Int. Cl.
*H01L 21/683* (2006.01)
*H01L 23/29* (2006.01)
*H01L 23/495* (2006.01)
*H01L 25/065* (2023.01)

(52) U.S. Cl.
CPC ...... *H01L 23/293* (2013.01); *H01L 23/49527* (2013.01); *H01L 25/0655* (2013.01)

(58) Field of Classification Search
CPC . H01L 25/0655; H01L 24/24; H01L 21/4825; H01L 23/4952; H01L 23/49575; H01L 24/82
See application file for complete search history.

(56) References Cited

U.S. PATENT DOCUMENTS

| | | | |
|---|---|---|---|
| 2013/0277813 A1* | 10/2013 | Torwesten | H01L 24/85 257/676 |
| 2018/0342453 A1 | 11/2018 | Ziglioli | |
| 2019/0115287 A1* | 4/2019 | Derai | H01L 24/73 |
| 2020/0203264 A1 | 6/2020 | Ziglioli | |
| 2020/0321274 A1 | 10/2020 | Magni | |
| 2021/0050226 A1 | 2/2021 | Derai et al. | |
| 2021/0050299 A1 | 2/2021 | Ziglioli et al. | |
| 2021/0183748 A1* | 6/2021 | Derai | H01L 23/49827 |
| 2021/0242167 A1* | 8/2021 | Yoo | H01L 25/0655 |
| 2023/0035445 A1 | 2/2023 | Vitello et al. | |
| 2023/0035470 A1 | 2/2023 | Albertinetti et al. | |

* cited by examiner

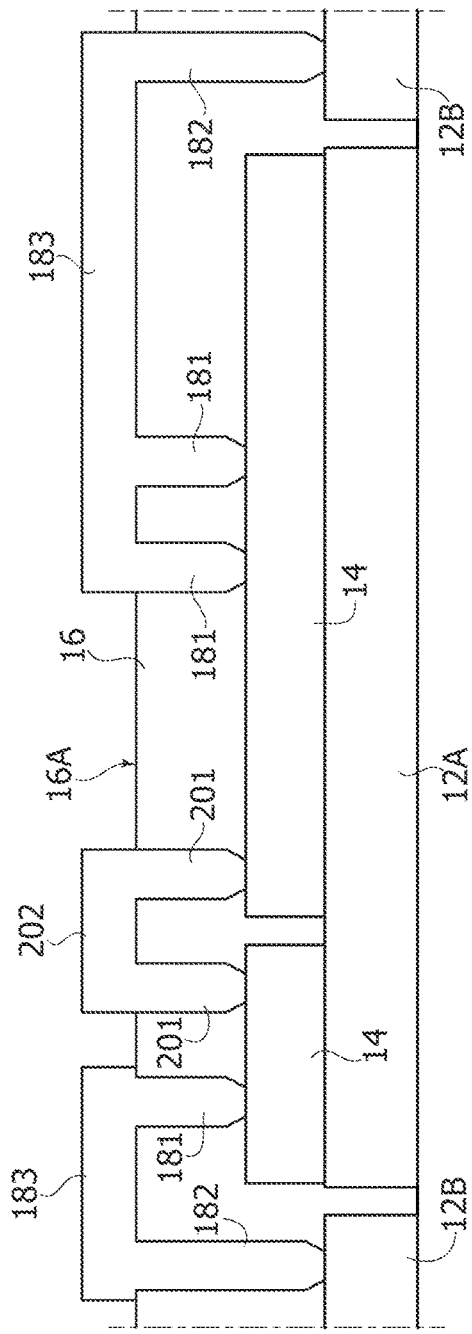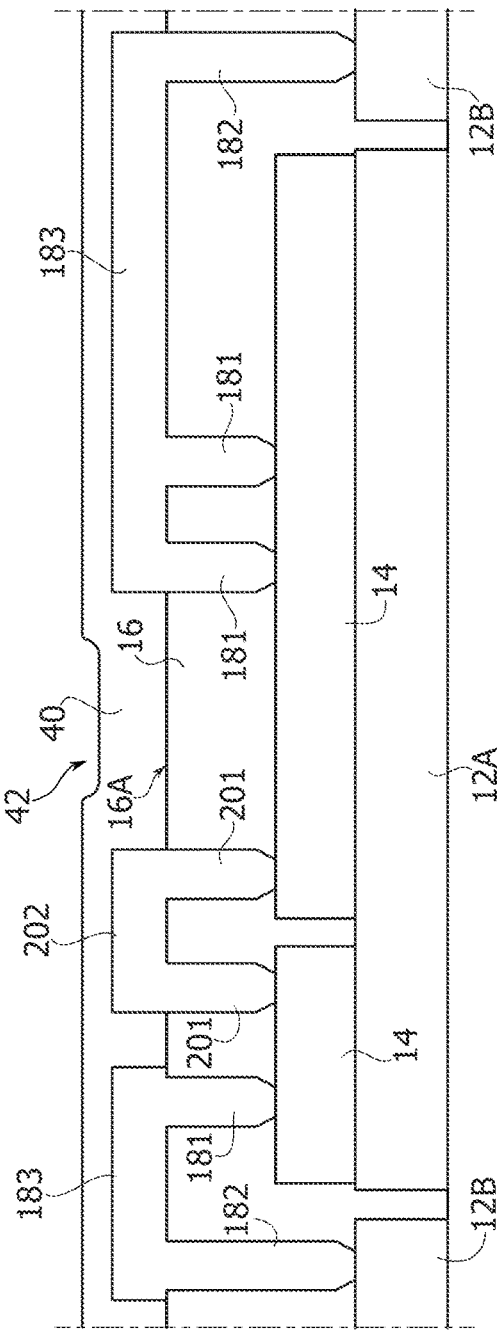

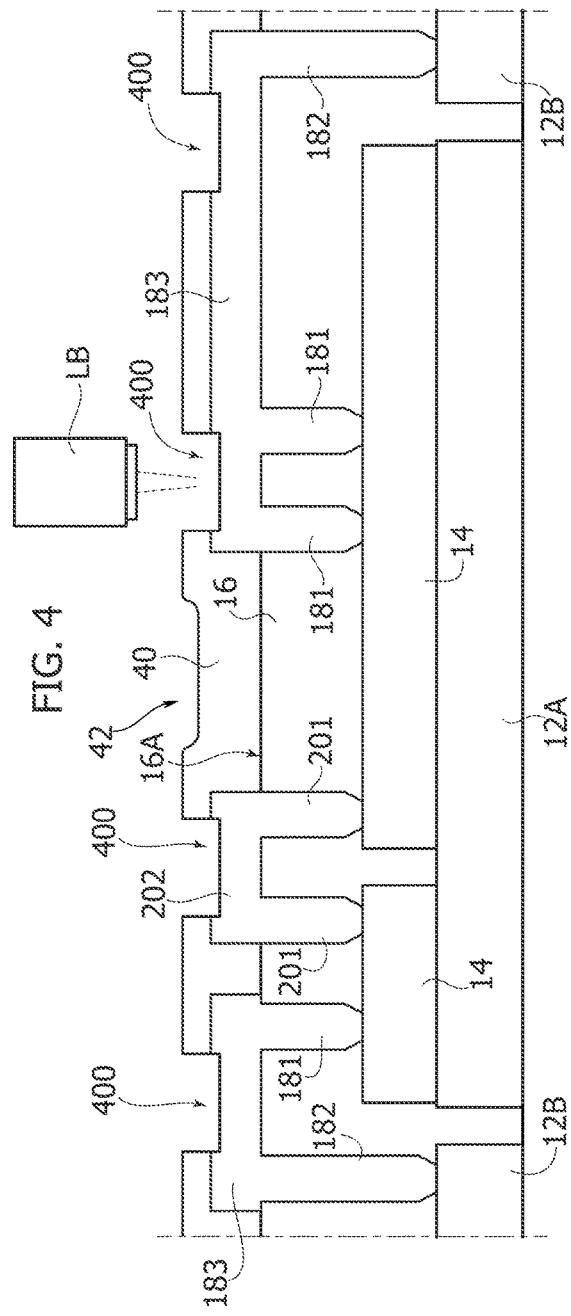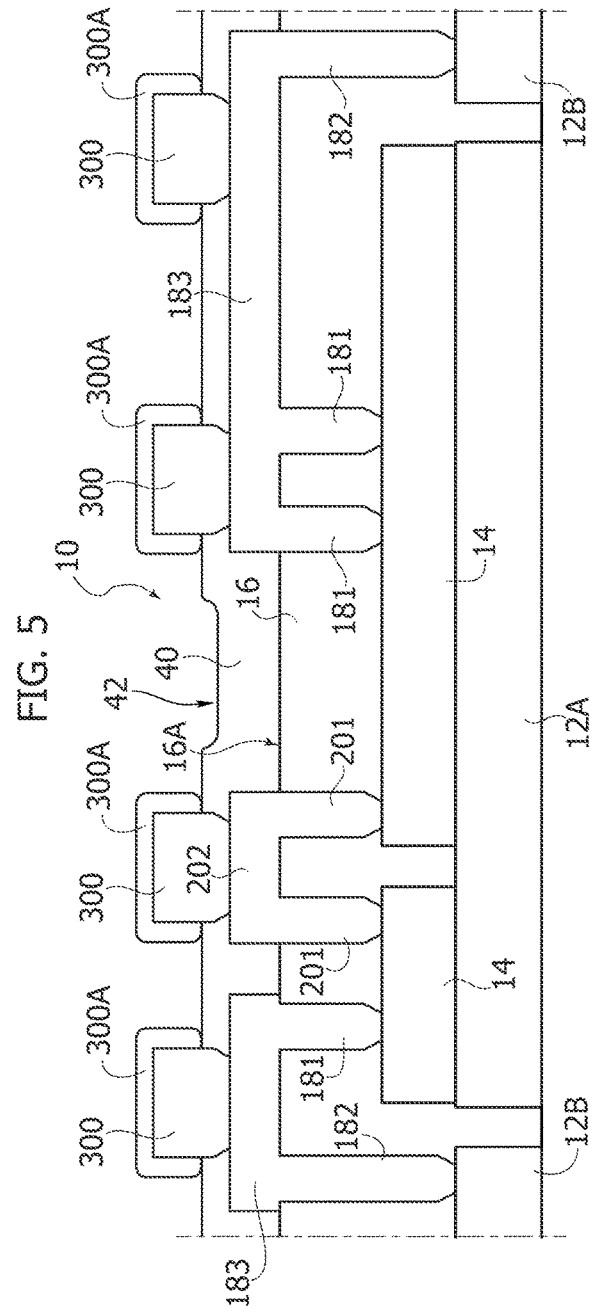

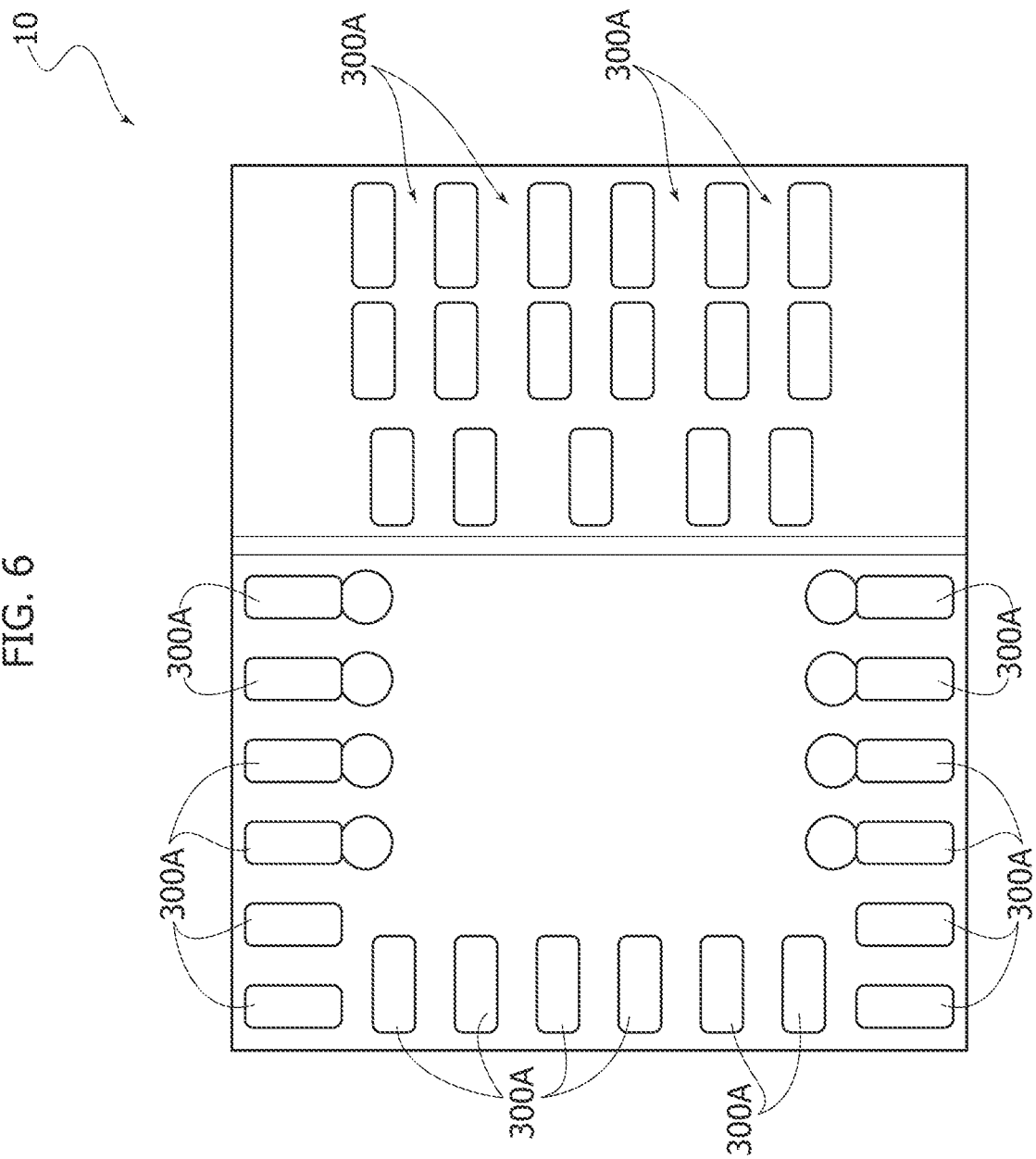

METHOD OF MANUFACTURING SEMICONDUCTOR DEVICES AND CORRESPONDING SEMICONDUCTOR DEVICE

BACKGROUND

Technical Field

The description relates to semiconductor devices.

Description of the Related Art

Laser direct structuring, LDS (oftentimes referred to also as direct copper interconnection or DCI technology) has been recently proposed to replace conventional wire bonding in providing die-to-lead electrical connections in a semiconductor device.

In such applications, a second level of molding can be applied to provide external leads on the device package (like in Ultra-Thin Quad-Flat No-leads or UQFN packages).

Standard molding processes are limited to a minimum thickness of about 200 microns in so far as uneven thickness issues may arise for lower values.

In the case of "vertical" MOSFET power devices, such a limitation in molding thickness may translate in an undesired limitation in the drain-source "on" resistance, $RDS_{ON}$, namely the total resistance between the drain and source, which is dictated by the length of the vertical interconnection path.

BRIEF SUMMARY

An object of one or more embodiments is to contribute in adequately dealing with such an issue.

According to one or more embodiments, that object is be achieved via a method having the features set forth in the claims that follow.

One or more embodiments relate to a corresponding semiconductor device.

Semiconductor devices as mentioned in the introduction to the present description may be exemplary of such device.

One or more embodiments provide an approach to reduce the vertical interconnection path in, e.g., MOSFET transistors using a thin vacuum laminated tape in the place of a second molding step in a mold chase.

One or more embodiments facilitate reducing such a vertical interconnection path to values as low as about 25 microns to about 40 microns.

One or more embodiments may contemplate laminating an electrically insulating tape over a first level produced via of LDS/DCI technology or possibly other additive manufacturing techniques such as Laser Induced Forward Transfer (LIFT) technology or jet-printing.

Semiconductor devices produced according to embodiments as discussed herein (a UQFN package, for instance) may comprise electroplated leads in combination with a laminated second mold.

BRIEF DESCRIPTION OF THE SEVERAL VIEWS OF THE DRAWINGS

One or more embodiments will now be described, by way of example only, with reference to the annexed figures, wherein:

FIGS. 2 to 5 are exemplary of steps in embodiments of the present description, and FIG. 6 is a plan view of a semiconductor device according to embodiments of the present description.

Corresponding numerals and symbols in the different figures generally refer to corresponding parts unless otherwise indicated.

Figure 1:
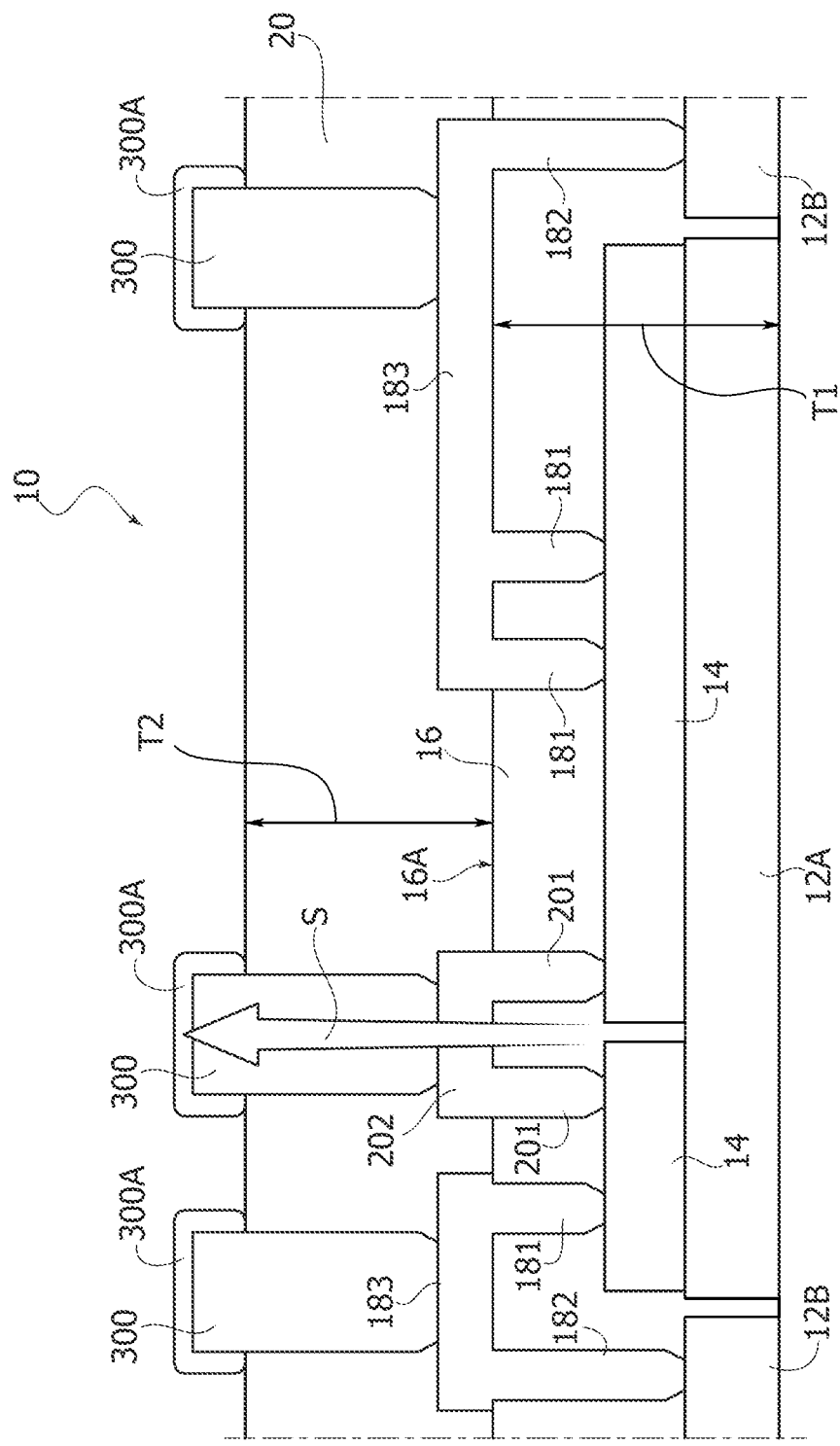
FIG. 1 is exemplary of the possible application of LDS/DCI technology to manufacturing semiconductor devices.

The figures are drawn to clearly illustrate the relevant aspects of the embodiments and are not necessarily drawn to scale.

The edges of features drawn in the figures do not necessarily indicate the termination of the extent of the feature.

DETAILED DESCRIPTION

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment," "in one embodiment," or the like, that may be present in various points of the present description do not necessarily refer exactly to one and the same embodiment. Furthermore, particular configurations, structures, or characteristics may be combined in any adequate way in one or more embodiments.

The headings/references used herein are provided merely for convenience and hence do not define the extent of protection or the scope of the embodiments.

One or more embodiments of the present disclosure can be applied, for instance, to manufacturing semiconductor devices using laser direct structuring (LDS)/direct copper interconnection (DCI) technology.

One or more embodiments of the present disclosure can be applied, for instance, to Quad-Flat No-leads semiconductor device packages.

One or more embodiments of the present disclosure can be applied, for instance, to "slug-up" semiconductor device packages.

GaN 100V and 650V semiconductor devices for LIDAR applications are exemplary of devices that can benefit from the embodiments.

FIG. 1 is representative of a possible application of LDS technology in providing various types of electrical coupling in an assembly flow of a semiconductor device 10 such as a Quad-Flat No-leads semiconductor device.

Currently, plural such devices are manufactured simultaneously to be finally separated into individual devices via a singulation step.

The figures refer for simplicity to a (single) device 10 comprising a leadframe having a die pad 12A and array of leads 12B around the die pad 12A.

One or more semiconductor chips or dice 14 are mounted, for instance attached via die attach material (not visible in the figures) on the die pad 12A. The die pad 12A can act as a dissipator of the heat produced by the dice 14 during operation.

The designation "leadframe" (or "lead frame") is currently used to indicate a metal frame that provides (at a die pad 12A, for instance) support for one or more integrated circuit chips or dice (these terms are used herein as synonyms) as well as electrical leads 12B to interconnect the integrated circuit in the chip(s) or die/dice 14 to other electrical components or contacts.

Essentially, a leadframe as illustrated herein comprises an array of electrically-conductive formations (leads) 12B that from an outline location extend inwardly in the direction of a semiconductor chip or die thus forming an array of electrically-conductive formations from one or more die pads 12A configured to have at least one semiconductor chip or die attached thereon.

This may be via conventional means such as a die attach adhesive (a die attach film or DAF, for instance).

Laser Direct Structuring, LDS (oftentimes referred to also as direct copper interconnection or DCI technology) is a laser-based machining technique now widely used in various sectors of the industrial and consumer electronics markets, for instance for high-performance antenna integration, where an antenna design can be directly formed onto a molded plastic part. In an exemplary process, the molded parts can be produced with commercially available resins that include additives suitable for the LDS process; a broad range of resins such as polymer resins like PC, PC/ABS, ABS, LCP are currently available for that purpose.

In LDS, a laser beam can be used to transfer a desired electrically-conductive pattern onto a plastic molding that may then be subjected to metallization (for instance via electroless plating with copper or other metals) to finalize a desired conductive pattern.

Documents such as US 2018/342453 A1, US2019/115287 A1, US 2020/203264 A1, US 2020/321274 A1, US 2021/050226 A1, US 2021/050299 A1 or US 2021/183748 A1 (all assigned to the same assignee of the present application) are exemplary of the possibility of applying LDS technology in manufacturing semiconductor devices. For instance, LDS technology facilitates replacing wires, clips or ribbons with lines/vias created by laser beam processing of an LDS material followed by metallization (growing metal such as copper through electroless and plating processes, for instance).

Still referring to FIG. 1, an encapsulation 16 of LDS material can be molded onto the leadframe 12A, 12B having the semiconductor chips or dice 14 mounted thereon. In some embodiments, the leadframe 12A, 12B may be replaced by a heat dissipation structure, may be present and in combination with a heat dissipation structure, or respective portions of the leadframe 12A, 12B may be heat dissipation structures.

Electrically-conductive die-to-lead coupling formations can be provided (in a manner known per se: see the commonly assigned applications cited in the foregoing, for instance) in the LDS material 16. For example, the LDS material may be a resin that is doped with an activated additive material that when exposed to a laser is activated such that the activated additive material become conductive.

As illustrated in FIG. 1, these die-to-lead coupling formations comprise:

first vias 181 extending through the LDS encapsulation 16 between the top (front) surface 16A of the encapsulation (opposed the leadframe 12A, 12B) and electrically-conductive pads (not visible for scale reasons) at the front or top surface of the chips or dice 14, second vias 182 extending through the LDS encapsulation 16 between the top (front) surface 16A of the encapsulation and corresponding leads 12B in the leadframe, and electrically-conductive lines or tracks (traces) 183 extending at the front or top surface 16A of the encapsulation 16 and electrically coupling selected ones of the first vias 181 with selected ones of the second vias 182 to provide a desired die-to-lead electrical connection (routing) pattern between the chips or dice 14 and the leads 12B.

Providing the electrically conductive die-to-lead formations 181, 182, and 183 essentially involves structuring these formations in the LDS material 16 (for instance, drilling vias therein at the desired locations for the vias 181, 182) followed by growing electrically-conductive material (a metal such as copper, for instance) at the locations activated (structured) via laser beam energy.

Further details on processing as discussed in the foregoing can be derived from the commonly-assigned applications referred to in the foregoing, for instance.

FIG. 1 also illustrates the possibility of providing in the encapsulation 16 of LDS material electrically-conductive die-to-die coupling formations comprising:

electrically-conductive die vias 201 extending through the LDS encapsulation 16 between the top (front) surface 16A of the encapsulation and die pads (not visible for scale reasons) at the top or front surface of the one and the other of two chips or dice 14, and electrically-conductive lines or tracks 202 extending bridge-like between the die vias 201 at the front or top surface 16A of the encapsulation 16 to complete a desired die-to-die coupling pattern.

The die-to-die coupling formations 201, 202 can be provided by resorting to the solutions (providing a temporary cathode electrode for metal plating after electroless metal growth or LIFT metal transfer after electroless metal growth) as disclosed in Italian patent applications 102021000020537 (Vitello and Derai, inventors) and 102021000020540 (Albertinetti and Alesi, inventors), assigned to the same assignee of the present application, not yet available to the public at the time of filing of the present application.

Whatever the details of providing the coupling formations 181, 182, 183 and 201, 202, as illustrated in FIG. 1 further encapsulation material 20 (this may be non-LDS material, such as conventional epoxy resin molding compound, for instance) can be molded onto the structure to complete the device 10 in order to facilitate sealing the formations 181, 182, 201 and the traces 183, 202).

Contact paths 300 can thus be formed through the (further) encapsulation material 20 to facilitate signal injection/extraction with respect to the coupling formations 181, 182, 183 and 201, 202 and thus with respect to the chips or dice 14 as indicated by the arrow S.

Tin plating 300A can be provided at the distal ends of the contact paths 300.

Steps as discussed in the foregoing facilitate providing a device configuration adapted for use in a "die pad up" configuration (that is, with the device 10 turned upside-down with respect to FIG. 1).

In such a configuration the top or front surface of the semiconductor dice 14 faces downwards with interconnection and package leads provided (see the distal ends of the contacts 300 with the plating 300A) located on the back or bottom side of the device package.

As discussed, standard molding processes as used to provide the further encapsulation layer 20 are limited to a minimum thickness T2 of about 200 microns in so far as uneven thickness issues may arise for lower values. As shown in FIG. 1, a thickness T1 of the LDS material 16 may be similar to the minimum thickness T2 of the encapsulation layer 20. In some embodiments, the thickness T1 of the LDS material 16 may be less than or greater than the minimum thickness T2 of the encapsulation layer 20. An overall thickness of the device 10 will be limited as the thickness T1 and the minimum thickness T2 may be limited to being reduce further than as shown in FIG. 1.

A solution as illustrated in FIG. 1 thus suffers from a disadvantage related to the thickness T2 of the layer 20.

For instance, in "vertical" MOSFET power devices, the drain-source "on" resistance, $RDS_{ON}$, namely the total resistance between the drain and source, is dictated by the length of the vertical interconnection paths as provided by the contacts 300. Consequently, such an "on" resistance cannot be reduced below the value corresponding to the minimum thickness T2 considered in the foregoing.

Such disadvantages become even worse in the case of multi-layer packages, which may end up by becoming undesirably thick. For example, a thickness that is too large may take up space not readily available in an electronic device that is desired to be thin.

In one or more embodiments as illustrated in FIGS. 2 to 6, the additional encapsulation layer 20 of FIG. 1 is replaced by a mold tape 40 laminated on the underlying structure. Such laminated mold tape can then be drilled to open vias for routing and lead creation. In some embodiments, the mold tape 40 may be a thin layer of dielectric material.

In that way, the lengths of contacts such as 300 can be reduced to a value more or less comparable with the thickness of such a mold tape (e.g., 25 to 40 micron).

Such a mold tape is commercially available and currently used in manufacturing semiconductor devices, for instance by being laminated on support dicing tape used in Wafer Level Chip Scale Packaging (WLCSP) technology as wafer backside coating.

The mold tapes available with LINTEC Corporation, of 23-23, Honcho, Itabashi-Ku, Tokyo, 1730001, Japan under the trade designations LC86R25 and LC88R40, the mold tapes of the mold tape series EB4000 available with Hitachi Chemical Co., Ltd. of Grand Tokyo South Tower, 1-9-2 Marunouchi, Tokyo, 100-6606, Japan, as well as the Ajinomoto sheet molding compound available with Ajinomoto Fine-Techno Co., Inc. 1-2 Suzuki-cho, Kawasaki-ku, Kawasaki-shi, 210-0801, Japan are exemplary of mold tapes suited for use in embodiments.

FIGS. 2 to 5 are exemplary of a possible sequence of steps in embodiments.

Those of skill in the art will otherwise appreciate that the sequence of steps or acts of FIGS. 2 to 5 is merely exemplary in so far as:
one or more steps illustrated can be omitted, performed in a different manner (with other tools, for instance) and/or replaced by other steps;
additional steps and may be added;
one or more steps can be carried out in a sequence different from the sequence illustrated.

Also, for the sake of simplicity and ease of understanding, parts or elements like or similar to parts or elements already discussed in connection with FIG. 1 are indicated throughout FIGS. 2 to 5 with the same reference symbols appearing in FIG. 1.

Unless the context indicates otherwise, the related description provided in connection with FIG. 1 will thus apply also to FIGS. 2 to 6 and a corresponding description will not be repeated for these latter figures.

Also, the fact that a certain part of element is indicated in FIGS. 2 to 6 with the same reference symbol used in FIG. 1 does not necessarily imply that such a part of element should be implemented in FIGS. 2 to 6 in the same manner of FIG. 1.

It will be otherwise appreciated that in the examples considered herein the formations 182 are used to provide electrical connections to the leads 12B (which are isolated for the die pad 12A), and thus to the substrate (leadframe), as in a conventional Quad-Flat No-leads (QFN) package. For "slug-up" QFN packages the connection are brought to the opposite side of the die pad (on top of the package) and connections as the connections 182 herein can be used as sacrificial lines to bring the current to all the other connections (like 183) for an electrochemical growth process. These sacrificial lines can then be eliminated during rest of the assembly process: in slug up QFNs all the leads are created on top of the package as exemplified here for connections 300/300A (such connection instead being not present in a conventional QFN).

It will thus be appreciated that the representation of the formations 182 as provided herein is just an exemplary case of the possible application of a thin laminated tape 40 as discussed in the following.

FIG. 2 is exemplary of the result of various steps leading, e.g., to semiconductor chips or dice 14 being attached on a leadframe 12A, 12B with an encapsulation of LDS material 16 molded thereon and die-to-lead coupling formations 181, 182, 183 as well as die-to-die coupling formations 201, 202 being formed therein as discussed in the foregoing in connection with FIG. 1: the related description thus applies (also) to FIG. 2. For example, the activated additive material within the LDS material 16 may be activated by being exposed to a laser forming one or more first conductive layers extending along respective surfaces of the LDS material 16 that is then covered by a second conductive material by performing a conductive plating technique.

FIG. 3 is exemplary of a step during which a mold tape 40 as discussed in the foregoing is applied (via otherwise conventional vacuum mounting) onto the structure of FIG. 2.

The tape 40 will thus extend over the tracks or traces 183, 202, by strictly conforming thereto and giving arise to a "bumped" outer profile. A recess 42 extends into the tape 40 and overlaps at least a portion of one of the dice 14.

FIG. 4 is exemplary of vias 400 drilled through the laminated mold tape 40, thus exposing (selected ones of) the tracks or traces 183 and 202 in order to facilitate creating electrical connections thereto through the mold tape.

Drilling vias (and possibly forming conducting tracks or traces extending therebetween) on top of the laminated mold tape 40 may be via laser beam energy schematically represented by LB in FIG. 4. Hatching is exemplary of a laser drilling process to ablate the tape material 40 using a laser beam (a UV laser beam, for instance).

FIG. 5 is exemplary of contacts 300 being formed in the vias 400.

In certain examples, the contacts 300 may be grown electrochemically (via an electrochemical bath, for instance).

Laser Induced Forward Transfer (LIFT) technology can be used to facilitate creating the connections 300 by filling the vias 400.

General information on the LIFT process can be found, for instance, in P. Serra, et al: "Laser-Induced Forward Transfer: Fundamentals and Applications," in Advanced Materials Technologies/volume 4, issue 1.

Whatever the technology used for growing the contacts 300, final plating of the exposed leads at 300A can be provided as exemplified in FIG. 5.

FIG. 6 is a plan view (from the top, with reference to the viewpoint of FIG. 5) showing a possible distribution of grown contacts 300 plated at 300A onto the (back or bottom side of) device 10.

Again, whatever the technology adopted for growing the contacts 300, these contacts will have a length (height in figures such as FIG. 5) essentially corresponding to the thickness (20-40 micron) of the mold tape 40.

The mold tape layer thickness has the advantage of being constant and controlled (also for small values as indicated) with a thickness value (which dictates the length/height of the contacts 300) smaller (much smaller, e.g., 20-40 micron) than the values (200 micron minimum) that can be achieved in a conventional molding process of the layer 20 as exemplified in FIG. 1.

Without prejudice to the underlying principles, the details and embodiments may vary, even significantly, with respect to what has been described by way of example only without departing from the extent of protection.

A method may be summarized as including arranging at least one semiconductor die (14) on a substrate (12A, 12B), molding an insulating encapsulation (16) onto the at least one semiconductor die (14) arranged on the substrate (12A, 12B), the encapsulation having a surface (16A) opposite the substrate (12A, 12B), providing in the encapsulation (16) electrically conductive formations (181, 182, 183; 201, 202) coupled to the at least one semiconductor die (14) arranged on the substrate (12A, 12B), laminating a tape (40) onto the surface (16A) of the encapsulation (16) opposite the substrate (12A, 12B), and providing through the tape (40) laminated onto the encapsulation (16) electrically conductive contacts (300) to the electrically conductive formations (181, 182, 183; 201, 202) coupled to the at least one semiconductor die (14) arranged on the substrate (12A, 12B).

The method may include laminating onto the surface (16A) of the encapsulation (16) opposite the substrate (12A, 12B) a tape (40) having a thickness less than 200 micron, preferably a thickness of about 20 microns to about 40 microns.

The method may include laminating said tape (40) onto the surface (16A) of the encapsulation (16) opposite the substrate (12A, 12B) via vacuum lamination, wherein the tape (40) laminated onto the surface (16A) of the encapsulation (16) may conform to electrically conductive formations (181, 182, 183; 201, 202) provided in the encapsulation (16).

Providing electrically conductive contacts (300) through the tape (40) laminated onto the encapsulation (16) may include opening, preferably by laser beam energy (LB), vias (400) through the tape (40) laminated onto the encapsulation (16), and forming, preferably via electrochemical deposition or via laser induced forward transfer, LIFT processing electrically conductive material in the vias (400) opened through the tape (40) laminated onto the encapsulation (16).

The method may include providing said electrically conductive contacts (300) with distal ends left exposed by the tape (40) laminated onto the encapsulation (16), and plating electrically conductive material (300A) onto said distal ends left exposed by the tape (40) laminated onto the encapsulation (16), wherein the electrically conductive material (300A) plated onto said distal ends left exposed by the tape (40) laminated onto the encapsulation (16) may protrude from the tape (40) laminated onto the encapsulation (16).

The method may include molding an insulating encapsulation (16) of laser direct structuring, LDS material onto the at least one semiconductor die (14) arranged on the substrate (12A, 12B), structuring said electrically conductive formations (181, 182, 183; 201, 202) coupled to the at least one semiconductor die (14) arranged on the substrate (12A, 12B) via laser beam processing (LB) of said insulating encapsulation (16).

The method may include providing in the encapsulation (16) electrically conductive formations (181, 182, 183) coupled to the substrate (12B).

A device (10) may be summarized as including at least one semiconductor die (14) arranged on a substrate (12A, 12B), an insulating encapsulation (16) molded onto the at least one semiconductor die (14) arranged on the substrate (12A, 12B), the encapsulation having a surface (16A) opposite the substrate (12A, 12B), electrically conductive formations (181, 182, 183; 201, 202) provided in the encapsulation (16) and coupled to the at least one semiconductor die (14) arranged on the substrate (12A, 12B), a tape (40) laminated onto the surface (16A) of the encapsulation (16) opposite the substrate (12A, 12B), and electrically conductive contacts (300) to the electrically conductive formations (181, 182, 183; 201, 202) coupled to the at least one semiconductor die (14) arranged on the substrate (12A, 12B), the electrically conductive contacts (300) extending through the tape (40) laminated onto the encapsulation (16).

The tape (40) laminated onto the surface (16A) of the encapsulation (16) opposite the substrate (12A, 12B) may have thickness less than 200 micron, preferably a thickness of about 20 microns to about 40 microns.

The device (10) may include said tape (40) vacuum laminated onto the surface (16A) of the encapsulation (16), wherein the vacuum-laminated tape may conform to electrically conductive formations (181, 182, 183; 201, 202) provided in the encapsulation (16).

Said electrically conductive contacts (300) may include distal ends left exposed by the tape (40) laminated onto the encapsulation (16), and electrically conductive material (300A) may be plated onto said distal ends left exposed by the tape (40) laminated onto the encapsulation (16), wherein the electrically conductive material (300A) plated onto said distal ends left exposed by the tape (40) laminated onto the encapsulation (16) may protrude from the tape (40) laminated onto the encapsulation (16).

The device (10) may include an insulating encapsulation (16) of laser direct structuring, LDS material molded onto the at least one semiconductor die (14) arranged on the substrate (12A, 12B), and said electrically conductive formations (181, 182, 183; 201, 202) coupled to the at least one semiconductor die (14) arranged on the substrate (12A, 12B) structured via laser beam processing (LB) of said insulating encapsulation (16).

The device (10) may include electrically conductive formations (181, 182, 183) provided in the encapsulation (16) and coupled to the substrate (12A, 12B).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
arranging at least one semiconductor die on a substrate;
forming an insulating encapsulation onto the at least one semiconductor die arranged on the substrate, the insulating encapsulation having a surface opposite the substrate;
forming in the insulating encapsulation electrically conductive formations coupled to the at least one semiconductor die arranged on the substrate;
laminating a tape onto the surface of the insulating encapsulation opposite the substrate and on the electrically conductive formations; and
forming through the tape electrically conductive contacts coupled to the electrically conductive formations.

2. The method of claim 1, wherein the tape includes a thickness less than 200 micron.

3. The method of claim 2, wherein the thickness of the tape is within a range or equal to upper and lower ends of the range from 20-microns to 40-microns.

4. The method of claim 1, wherein laminating the tape onto the surface of the encapsulation opposite the substrate includes vacuum lamination, and vacuum laminating the tape onto the surface of the encapsulation conforms the tape to the electrically conductive formations.

5. The method of claim 1, wherein forming through the tape the electrically conductive contacts includes:
forming vias through the tape to respective electrically conductive formations of the electrically conductive formations, and
forming an electrically conductive material in the vias extending through the tape to the respective electrically conductive formations of the electrically conductive formations.

6. The method of claim 1, wherein:
forming through the tape the electrically conductive contacts includes forming the electrically conductive contacts with distal ends exposed from the tape; and
forming through the tape the electrically conductive contact includes plating an electrically conductive material onto the distal ends exposed from the tape, and the electrically conductive material plated onto the distal ends protrudes from the tape.

7. The method of claim 1, wherein:
the insulating encapsulation is a laser direct structuring (LDS) material,
forming the electrically conductive formations includes structuring the electrically conductive formations by exposing the insulating encapsulation of the laser direct structuring material to a laser.

8. The method of claim 1, wherein forming in the insulating encapsulation material the electrically conductive formations coupled to the at least one semiconductor die arranged on the substrate includes forming in the insulating encapsulation at least one respective electrically conductive formation of the electrically conductive formations coupled to the substrate.

9. A device, comprising:
at least one semiconductor die arranged on a substrate,
an insulating encapsulation molded onto the at least one semiconductor die arranged on the substrate, the encapsulation having a surface opposite the substrate,
electrically conductive formations in the insulating encapsulation and coupled to the at least one semiconductor die arranged on the substrate,
a tape laminated onto the surface of the encapsulation opposite the substrate, and
electrically conductive contacts extending through the tape to the electrically conductive formations, the electrically conductive contacts are coupled to the electrically conductive formations, and the electrically conductive contacts are coupled to the at least one semiconductor die arranged on the substrate.

10. The device of claim 9, wherein the tape laminated onto the surface of the encapsulation opposite the substrate has thickness less than 200 micron.

11. The device of claim 10, the thickness of the tape is within a range or equal to upper and lower ends of the range from 20-microns to 40-microns.

12. The device of claim 9, wherein:
the electrically conductive contacts include distal ends that protrude from the tape; and
the distal ends that protrude from the tape are covered by an electrically conductive material; and
the electrically conductive material covering the distal ends exposed from the tape and protrudes from the tape.

13. The device of claim 9,
wherein the insulating encapsulation is a laser direct structuring (LDS) material.

14. The device of claim 9, wherein the electrically conductive formations includes at least one electrically conductive formation of the electrically conductive formations in the encapsulation that is coupled to the substrate.

15. The device of claim 9, wherein the tape is a vacuum laminated tape on the surface of the encapsulation, and the vacuum-laminated tape conforms to electrically conductive formations in the insulating encapsulation.

16. A device, comprising:
a substrate including a first surface and a second surface opposite to the first surface;
a first die on the first surface of the substrate, the first die including a third surface facing away from the first surface;
a laser direct structuring (LDS) resin on third surface of the first die and on the first surface of the substrate, the laser direct structuring resin including a fourth surface facing away from the first surface and the third surface, respectively;
a first conductive via extending into the LDS resin to the third surface of the first die;
a first conductive line on the fourth surface of the LDS resin and is coupled to the first conductive via;
a laminated tape on the first conductive line and on the fourth surface, the laminated tape including a fifth surface facing away from the first surface, the third surface, and the fourth surface, respectively;
a first conductive contact that extends into the laminated tape to the first conductive line, the first conductive contact is coupled to the first conductive line, and the first conductive contact including a first distal end that protrudes from the fifth surface of the lamination tape; and
a conductive material covers the first distal end of the first conductive contact.

17. The device of claim 16, further comprising:
a second die on the first surface of the substrate, the second die including a sixth surface facing away from the first surface, the second die being within the LDS resin;
a second conductive via extends into the LDS resin to the third surface of the first die;
a second conductive line is on the fourth surface of the LDS resin and is coupled to the second conductive via, the second conductive line is within the laminated tape;
a second conductive contact extends into the laminated tape to the second conductive line, the second conductive contact is coupled to the second conductive line, and the second conductive contact including a second distal end that protrudes from the fifth surface of the lamination tape, the second distal end is covered by the conductive material.

18. The device of claim 17, further comprising a third conductive via extending into the LDS resin to the second die, the third conductive via is coupled to the first conductive line.

19. The device of claim 17, further comprising:
a second die on the first surface of the substrate, the second die including a sixth surface facing away from the first surface, the second die being within the LDS resin; and
a second conductive via extending into the LDS resin to the third surface of the first die, the second conductive via is coupled to the first conductive line.

20. The device of claim 19, further comprising:
a third conductive via extends into the LDS resin to the third surface;
a second conductive line is on the fourth surface of the LDS resin and is coupled to the second conductive via, the second conductive line is within the laminated tape; and
a second conductive contact extends into the laminated tape to the second conductive line, the second conductive contact is coupled to the second conductive line, and the second conductive contact including a second distal end that protrudes from the fifth surface of the lamination tape, the second distal end is covered by the conductive material.

21. The device of claim 17, wherein:
the LDS resin includes a first thickness that extends from the second surface of the substrate to the fourth surface of the LDS resin;
the lamination tape includes a second thickness that extends from the fourth surface of the LDS resin to the fifth surface of the lamination tape; and
the second thickness of the lamination tape is less than the first thickness of the LDS resin.

22. The device of claim 17, wherein the LDS resin is doped with an activated additive material that is activated and becomes conductive when exposed to a laser.

* * * * *